United States Patent
Umeno (10) Patent No.: US 8,592,967 B2
(45) Date of Patent: Nov. 26, 2013

(54) SEMICONDUCTOR APPARATUS AND POWER SUPPLY CIRCUIT

(75) Inventor: Tohru Umeno, Tottori (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 13/146,603

(22) PCT Filed: Jan. 28, 2010

(86) PCT No.: PCT/JP2010/051150
§ 371 (c)(1), (2), (4) Date: Jul. 27, 2011

(87) PCT Pub. No.: WO2010/087407
PCT Pub. Date: Aug. 5, 2010

(65) Prior Publication Data
US 2011/0284989 A1     Nov. 24, 2011

(30) Foreign Application Priority Data
Jan. 28, 2009 (JP) .................................. 2009-017284

(51) Int. Cl.
*H01L 23/48* (2006.01)
*H01L 23/52* (2006.01)

(52) U.S. Cl.
USPC ........... 257/692; 257/735; 257/787; 257/696; 257/E23.031; 257/E23.043; 257/E23.046; 438/123; 438/124; 438/127; 336/98; 336/205; 336/208

(58) Field of Classification Search
USPC ............. 257/692–697, 787–796, E23.031, 257/E23.043, E23.046, 735; 438/124, 127, 438/123; 336/98, 205, 208
See application file for complete search history.

(56) References Cited

U.S. PATENT DOCUMENTS

| 6,879,034 B1 * | 4/2005 | Yang et al. ..................... 257/700 |
| 7,675,180 B1 * | 3/2010 | St. Amand et al. ............ 257/777 |
| 2001/0035579 A1 * | 11/2001 | Yoshida et al. ................ 257/728 |
| 2005/0176171 A1 | 8/2005 | Miyaki et al. |
| 2007/0247268 A1 * | 10/2007 | Oya et al. ...................... 336/200 |
| 2007/0290782 A1 * | 12/2007 | Yokoyama et al. ........... 336/200 |
| 2008/0055859 A1 * | 3/2008 | Furukawa et al. ............. 361/704 |

FOREIGN PATENT DOCUMENTS

| JP | 2-187054 A | 7/1990 |
| JP | 2003-303919 A | 10/2003 |
| JP | 2005-183890 A | 7/2005 |
| JP | 2007-081146 A | 3/2007 |
| JP | 2007-173712 A | 7/2007 |
| JP | 2007-250924 A | 9/2007 |
| JP | 2008-060426 A | 3/2008 |
| JP | 2008-112941 A | 5/2008 |

* cited by examiner

Primary Examiner — Kimberly Rizkallah
Assistant Examiner — Maria Ligai
(74) Attorney, Agent, or Firm — Sughrue Mion, PLLC (57) ABSTRACT

A semiconductor apparatus comprising an integrated semiconductor circuit device having pluralities of electrode pads, pluralities of first external terminals connected to the electrode pads of the integrated semiconductor circuit device, an inductor disposed in a region surrounded by the first external terminals, and a resin portion sealing them, the integrated semiconductor circuit device being arranged on an upper surface of the inductor, and the inductor being exposed from a lower surface of the resin portion together with the first external terminals.

17 Claims, 12 Drawing Sheets

SEMICONDUCTOR APPARATUS AND POWER SUPPLY CIRCUIT

CROSS REFERENCE TO RELATED APPLICATIONS

This application is a National Stage of International Application No. PCT/JP2010/051150 filed Jan. 28, 2010, claiming priority based on Japanese Patent Application No. 2009-017284 filed Jan. 28, 2009, the contents of all of which are incorporated herein by reference in their entirety.

FIELD OF THE INVENTION

The present invention relates to a semiconductor apparatus in which an integrated semiconductor circuit device comprising switching transistors and a control circuit and an inductor are resin-sealed, particularly to a semiconductor apparatus constituting a DC-DC converter, and a power supply circuit comprising such a semiconductor apparatus.

BACKGROUND OF THE INVENTION

Various portable electronic apparatuses (cell phones, personal digital assistants PDA, note-type personal computers, DVD players, CD players, digital cameras, digital video cameras, etc.) comprise secondary batteries such as lithium ion batteries as power supplies. Because lithium ion batteries usually generate voltage of about 3.6 V (3.0 V to 4.2 V), electronic apparatuses comprise step-down or step-up DC-DC converters for obtaining operation voltage. The DC-DC converters are used in charging circuits, too.

A DC-DC converter generally has a structure comprising an integrated semiconductor circuit device (active device) comprising switching devices and a control circuit, and passive devices such as inductors, capacitors, etc. mounted on a printed circuit board. However, with the miniaturization of electronic apparatuses requiring the miniaturization of DC-DC converters, proposals have been made to provide small DC-DC converters comprising integrated semiconductor circuit devices mounted on multi-layer substrates containing capacitors and inductor coils.

Figure 14:
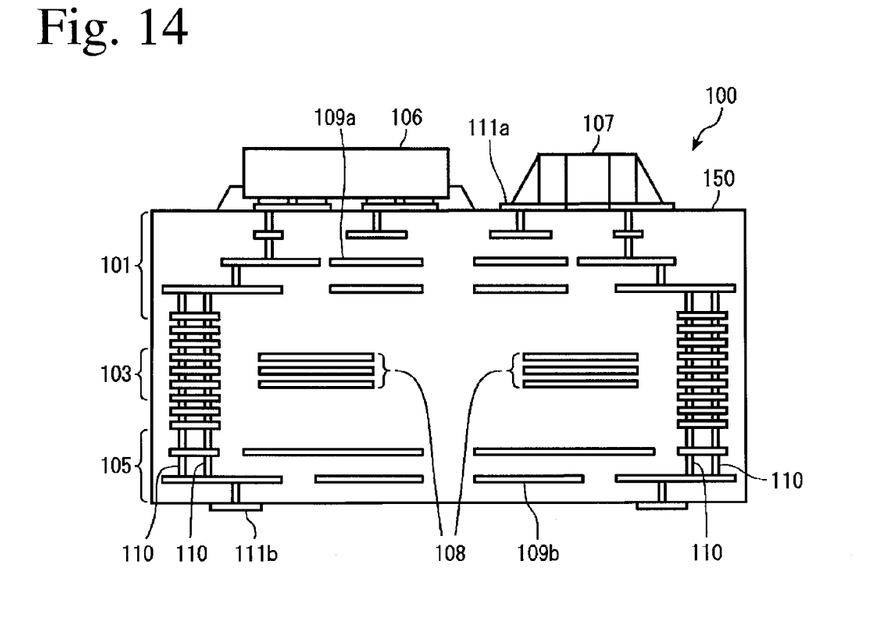
FIG. 14 is a cross-sectional view showing a conventional semiconductor apparatus.

JP 2005-183890 A discloses, as shown in FIG. 14, a DC-DC converter comprising an integrated semiconductor circuit 106, a capacitor 107, etc. mounted on a laminate 150 containing an inductor coil. The laminate 150 has an upper surface provided with pluralities of external electrodes 111a for mounting the integrated semiconductor circuit 106, etc., and a lower surface provided with pluralities of external electrodes 11 1b for connection to a mounting board. In first wiring layers 101 in the laminate 150, first conductor patterns 109a connected to the external electrodes 111a are formed on pluralities of non-magnetic layers. In coil layers 103 beneath the first wiring layers 101, coil-forming conductor patterns 108 are formed on pluralities of magnetic layers. In second wiring layers 105 beneath the coil layers 103, second conductor patterns 109b connected to the second external electrodes 111b are formed on pluralities of non-magnetic layers. In a peripheral portion of the laminate 150, via-holes 110 penetrating the first wiring layers 101, the coil layers 103 and the second wiring layers 105 are formed.

However, because the integrated semiconductor circuit device 106 is connected to lower surface pads through via-holes 110 in the laminate 150, the via-holes 110 generate parasitic inductance, reducing the efficiency of the DC-DC converter and causing the oscillation of output voltage, resulting in the unstabilized operation. Also, because the integrated semiconductor circuit device 106 is packaged, it is more expensive than a bare-chip type. Further, this DC-DC converter is poor in the heat dissipation of the integrated semiconductor circuit device 106.

Figure 15:
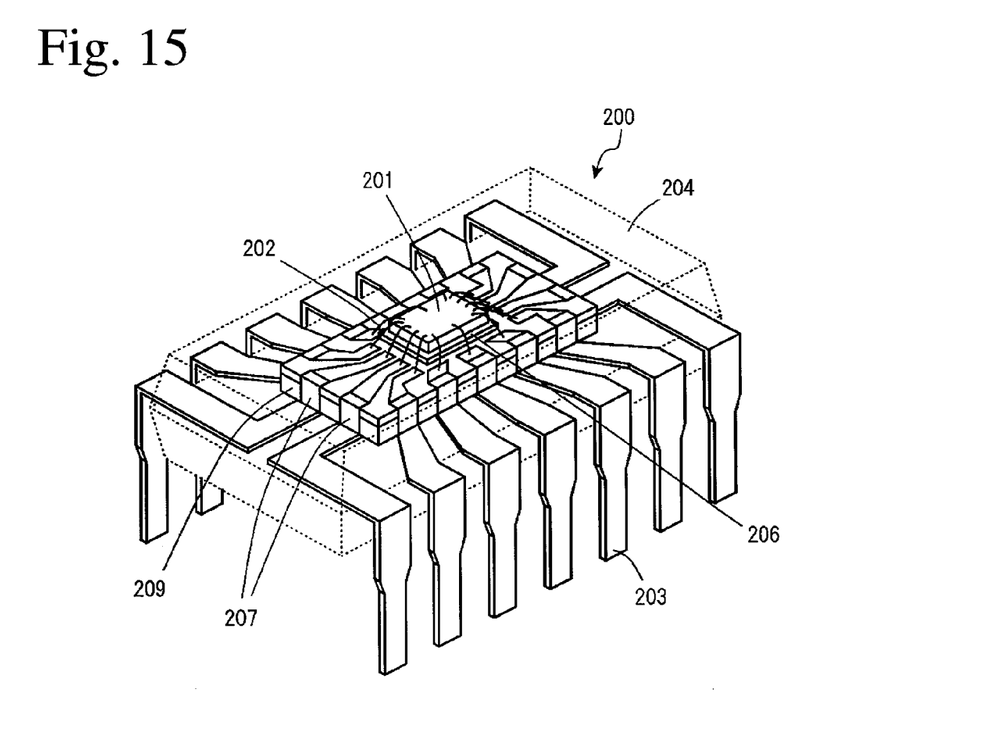
FIG. 15 is a perspective view showing the internal structure of another conventional semiconductor apparatus.

JP 2-187054 A discloses, as shown in FIG. 15, a semiconductor apparatus 200 comprising an integrated semiconductor circuit device 201 mounted on a laminate 209 containing an inductor, etc., and sealed by a molding resin 204 together with lead terminals 203 connected by bonding. The semiconductor apparatus 200 has a DIP (dual in-line package)-type package structure, and the lead terminals 203 are connected to terminals 207 on the side surfaces of the laminate 209, and connected to the integrated semiconductor circuit device 201 via bonding wires 202. With this structure, heat in the integrated semiconductor circuit device 201 is conducted to the laminate 209. However, because it is entirely sealed by the molding resin, heat does not dissipate easily. Also, because of smaller lead terminals 203 by the miniaturization of the semiconductor apparatus 200, the lead terminals 203 have an insufficient heat dissipation function. Further, the entirely molded structure is not suitable for miniaturization.

Figure 16:
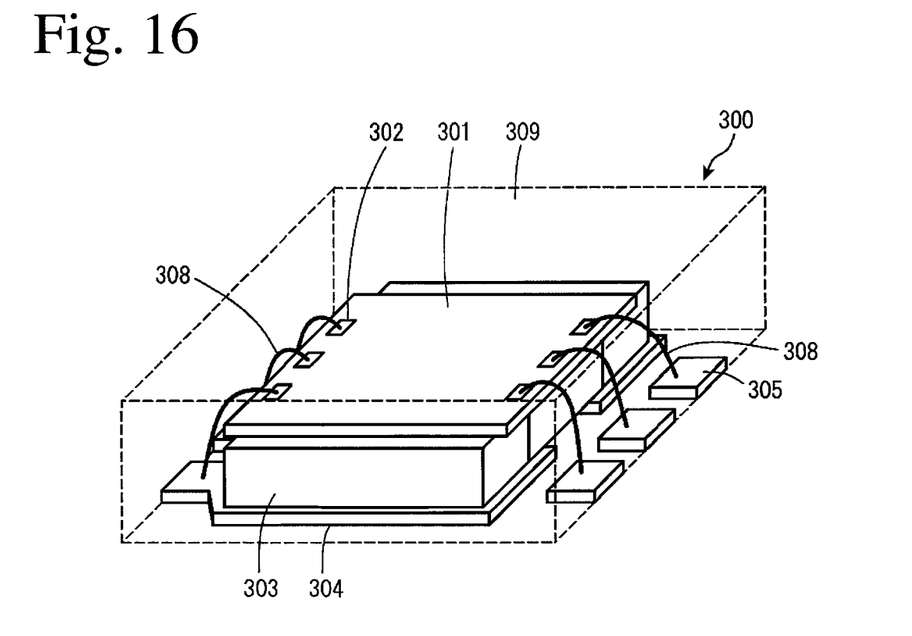
FIG. 16 is a perspective view showing the internal structure of a further conventional semiconductor apparatus.

JP 2007-81146 A discloses, as shown in FIG. 16, a QFN (quad flat non-leaded package)-type DC-DC converter 300 comprising a laminate inductor 303 arranged on a conductive support plate 304 continuous to lead terminals 305 and exposed on the outer surface, and a bare-chip-type, integrated semiconductor circuit device 301 arranged thereon, and sealed by a molding resin 309. The lead terminals 305 are connected to electrode pads 302 formed on an upper surface of the integrated semiconductor circuit device 301 via bonding wires 308. The structure having the laminate inductor 303 arranged on the conductive support plate 304 exposed on the outer surface is better than that of JP 2-187054 A in heat dissipation and miniaturization, but such structure makes the DC-DC converter 300 thicker by the thickness of the conductive support plate 304. A thin conductive support plate 304 for making the DC-DC converter 300 thinner has insufficient strength, and a thin inductor 303 has a low Q value and increased magnetic flux leakage.

There is at present a requirement for making semiconductor apparatuses such as DC-DC converters, etc. as thin as 1.0 mm or less in accordance with the thickness of other parts, but the conventional structures cannot be thin without the deterioration of characteristics or cost increase.

OBJECT OF THE INVENTION

Accordingly, an object of the present invention is to provide a stably operable semiconductor apparatus with excellent heat dissipation, which has been made smaller and thinner without suffering the deterioration of characteristics or cost increase, and a power supply circuit comprising it.

DISCLOSURE OF THE INVENTION

Thus, the semiconductor apparatus of the present invention comprises an integrated semiconductor circuit device having pluralities of electrode pads, pluralities of first external terminals connected to the electrode pads of the integrated semiconductor circuit device, an inductor disposed in a region surrounded by the first external terminals, and a resin portion sealing them, the integrated semiconductor circuit device being arranged on an upper surface of the inductor, and the inductor being exposed from a lower surface of the resin portion together with the first external terminals.

The exposure of the inductor and the first external terminals from the bottom surface of the semiconductor apparatus is advantageous for height reduction. Attaching the inductor to a mounting board directly or via a heat-dissipating member such as a heat-dissipating silicone, etc., it is possible to efficiently dissipate heat from the integrated semiconductor circuit device to the mounting board having a large heat capacity, thereby suppressing the temperature elevation of the integrated semiconductor circuit device and the inductor to ensure the stable operation of the semiconductor apparatus.

Lower surfaces of the first external terminals and a lower surface of the inductor are preferably substantially on the same plane. With small height difference, the entire semiconductor apparatus can be made thin. With the inductor closely attached to the mounting board via a good heat conductor, etc., heat generated by the integrated semiconductor circuit device can be efficiently dissipated to the mounting board.

The lower surface of the inductor is preferably provided with dummy terminals not electrically connected to the first external terminals. In place of providing the semiconductor apparatus with connecting lines for the second external terminals and the first external terminals, the mounting board may be provided with connecting lines for connecting them to reduce parasitic inductance, and increase connecting strength with increased connecting portions between the semiconductor apparatus and the mounting board. The second external terminals act as heat dissipation paths, too. In this case, to ensure connecting reliability to the mounting board, the height difference between the lower surfaces of the first external terminals and the lower surface of the inductor is preferably as small as possible.

The upper surface of the inductor is preferably provided with internal terminals, which are connected to the first external terminals via wires. Parasitic inductance due to the connecting wires is sufficiently smaller than that due to the connecting lines.

When the second external terminals and the internal terminals are respectively formed on the lower and upper surfaces of the inductor, each terminal may extend to the side surface, but it preferably does not extend over both upper and lower surfaces. When terminals having low adhesion to the resin due to a plating film on the surface extend over both upper and lower surfaces, the inductor is likely detached from the resin portion, or the resin likely loses air tightness.

The inductor is preferably in a rectangular plate shape, whose side surfaces have steps or inclination such that the inductor has a larger upper surface than a lower surface. This prevents the inductor from detaching from the sealing resin, and the sealing resin from losing air tightness.

Adjacent first external terminals are preferably connected via a capacitor, and sealed by the resin portion. This miniaturizes the power supply circuit.

The first external terminals can be constituted by lead terminals of a leadframe or terminal portions of a resin substrate. When the first external terminals are constituted by lead terminals of the leadframe, each lead terminal may be in a shape having a lower end portion bent outward from the lower surface of the inductor, and an upper end portion bent toward the upper surface of the inductor. With such a shape, parasitic inductance by bonding wires can be reduced, and heat dissipation can be accelerated through the upper end portions of the lead terminals connected to the inductor directly or via internal terminals formed on the upper surface thereof.

The integrated semiconductor circuit device is preferably flip-chip bonded to the upper end portions of the first external terminals extending on the upper surface of the inductor.

The power supply of the present invention comprises the above semiconductor apparatus.

DESCRIPTION OF THE PREFERRED EMBODIMENTS

As shown in FIGS. 1(a)-1(d), the semiconductor apparatus 1 according to one embodiment of the present invention comprises an integrated semiconductor circuit device 30 having pluralities of electrode pads 31, pluralities of first external terminals 15a connected to the electrode pads 31 of the integrated semiconductor circuit device 30 via bonding wires 35, an inductor 10 disposed in a region 56 surrounded by the first external terminals 15a, and a resin portion 25 sealing them, the integrated semiconductor circuit device 30 being arranged on an upper surface of the inductor 10, and the inductor 10 being exposed from a lower surface of the resin portion 25 together with the first external terminals 15a. The inductor 10 exposed on a bottom surface of the semiconductor apparatus 1 is surrounded with a margin by the first external terminals 15a and dummy terminals 15b, which are arranged in a peripheral portion of the bottom surface of the semiconductor apparatus 1 such that they are exposed on the bottom and side surfaces of the semiconductor apparatus 1, and sealed by the molding resin 25. This structure is a so-called lead-free type [quad flat non-leaded package (QFN)], in which the first external terminals 15a and the dummy terminals 15b do not extend from the side surfaces of the semiconductor apparatus 1. Of course, it is not restrictive, but leads may extend from the side surfaces. The dummy terminals 15b are not electrically connected.

The upper surface of the semiconductor apparatus covered with the molding resin 25 is provided with a mark (shown by a white circle in the figure) on the side of the first external terminals 15a, and printed with information such as the names of the manufacturer and the product, the lot number, etc. by ink or a laser. The molding resin 25 need only be a resin having excellent adhesion, a high glass transition temperature, a low molding shrinkage ratio and low elasticity with small variation, for instance, a composition of an epoxy resin containing a curing agent (a phenol or biphenyl resin) and amorphous silica. Specific examples of the epoxy resins include cresol novolak epoxy resins, phenol novolak epoxy resins, biphenyl diepoxy resins, naphthol novolak epoxy resins, etc. The molding resin 25 may contain fillers for controlling heat shrinkage, flame retarders, etc. The thermal conductivity of the epoxy resins, etc. is about 0.2-1 W/m·K.

The resin molding can be conducted by a trans-molding method or a printing method. In the case of the printing method, it is preferable to use a vacuum printing method or a differential-pressure-filling method for two-stage vacuum degree printing, lest that voids are generated in portions into which the molding resin is not easily charged (for instance, portions under the wires). The curing conditions may be properly determined depending on the molding resin, but preferable is usually heating at 150-250° C. for 1-5 hours.

Figure 2:
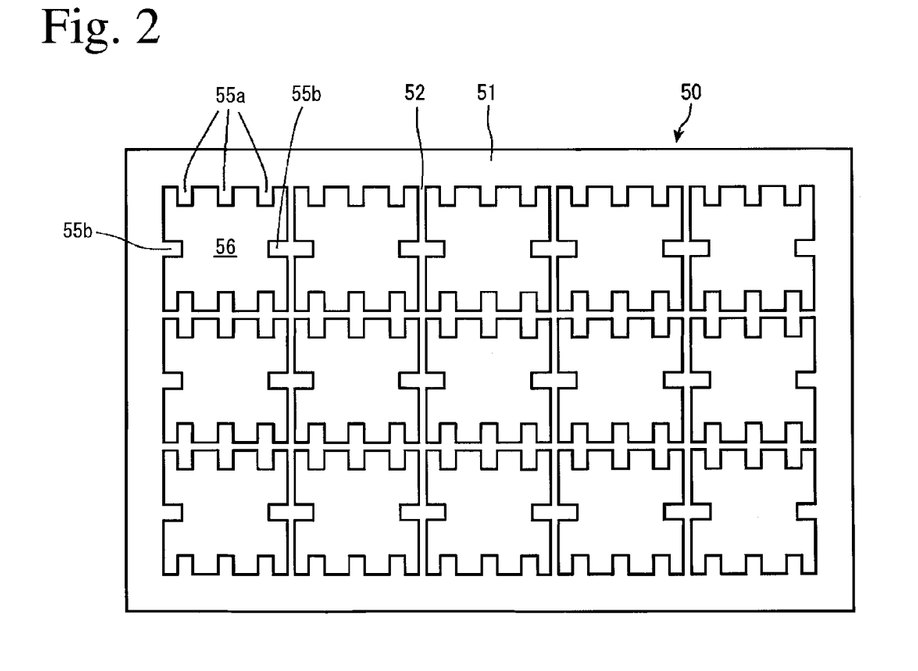
FIG. 2 is a plan view showing a leadframe used for the production of the semiconductor apparatus of the present invention.

The first external terminals 15a and the dummy terminals 15b can be formed by leads 55a, 55b of the leadframe 50 shown in FIG. 2. The leadframe 50 comprises pluralities of leads 55a, 55b integrated by a frame 51 and tie bars 52, and the leads 55a are connected to the electrode pads 31 of the integrated semiconductor circuit device 30 via bonding wires 35. Although the die pads for mounting the integrated semiconductor circuit device are generally supported by suspending leads in a region surrounded by pluralities of leads, the die pads are not used in the present invention, but the region surrounded by the leads has an opening having the size of the inductor 10.

The leadframe used in the present invention is made of metals such as Fe—Ni alloys (for instance, 42 Alloy), copper, aluminum, gold, etc., and its thickness and shape are not restricted. For instance, a metal plate having a thickness of about 0.1-0.5 mm is preferably pressed or etched to a desired shape, and then plated with Ag, Au, Ni—Pd—Au or Au—Pd.

42 Alloy has thermal conductivity of about 15 W/m·K, and Cu, Ag and aluminum have thermal conductivity of about 200-400 W/m·K.

The interval of the leads is properly determined depending on the number of terminals and wire bondability, and may be made as small as up to about 0.1 mm. To have many leads with a small pitch, a metal ribbon is preferably coated with a photoresist and etched to a predetermined pattern. The etching may be carried out by a wet method or a dry method.

To arrange the inductor 10 in the region 56 surrounded by the leads 55a, 55b precisely, with an assembly tape attached to a rear surface of the leadframe 50, and with the leadframe 50 on the assembly tape side supported by an adsorbing means, etc., the inductor 10 is disposed with high precision on the assembly tape exposed in the region 56 by a chip mounter. The assembly tape, which is not peeled until a resin-sealing step, holds the leads 55a, 55b to be separated finally, to prevent their surfaces from being covered with the molding resin.

Because the production of the semiconductor apparatus comprises a step of adhering the integrated semiconductor circuit device, a wire-bonding step, and a heating step such as the resin-sealing step, etc, the assembly tape preferably comprises a support film made of heat-resistant resins such as polyimides, polyethylene naphthalate, etc. and an adhesion layer formed on one surface of the support film. Particularly, polyimides having glass transition temperatures of 200° C. or higher are preferable for the support film. Taking into consideration adhesion during assembling, heat resistance and peelability, the adhesion layer is preferably made of a thermoplastic resin having an ester group, an amide group, an imide group, an ether group, or a sulfone group. The temperature of attaching the assembly tape to the leadframe is preferably 150-300° C.

To prevent bending after attaching the assembly tape to the leadframe, the assembly tape preferably has a linear thermal expansion coefficient close to that of the leadframe. Though not restrictive, the thickness of the assembly tape is preferably 10-150 μm, taking into consideration the bending of the leadframe and the easiness of handling after attaching.

A bare-chip, integrated semiconductor circuit device 30 is disposed on the inductor 10. Using an ultrasonic bonder, etc., an end of a bonding wire is connected to each electrode pad 31 of the integrated semiconductor circuit device 30. The bonding wires may comprise a precious metal such as gold, silver, platinum, etc. as a main component, in addition to a transition metal such as copper, aluminum, etc. The integrated semiconductor circuit device 30 is fixed to the inductor 10 by a solder, a conductive paste, a conductive adhesive, a DAF (die attach film) tape, etc. DAF is easy to handle with suppressed outgassing, preventing the contamination of the leads, and not hindering wire bonding.

The low-height inductor 10 may be, for instance, a wound type comprising a copper wire wound around a ferrite core, and a laminate type comprising insulation layers of low-temperature co-fired ceramics (LTCC), etc. and strip electrodes alternately laminated to form a coil, and the laminate inductor is preferable taking the reduction of height and magnetic flux leakage, etc. into consideration.

Figure 3A:
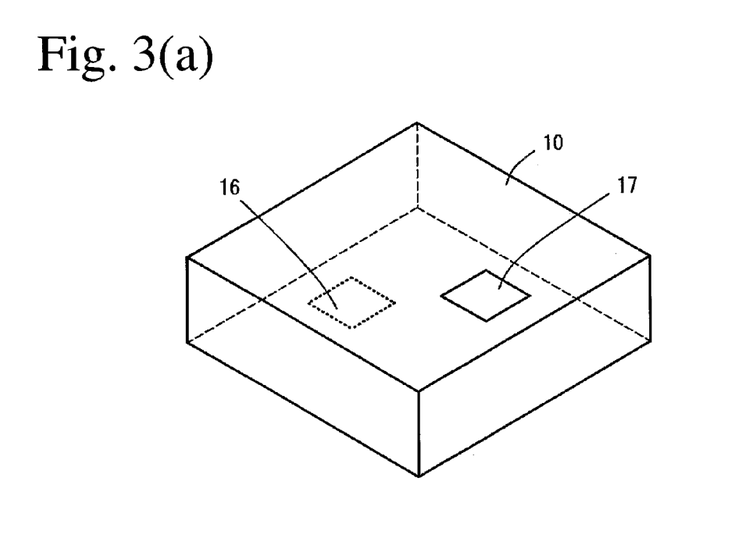
FIG. 3(a) is a perspective view showing the appearance of an inductor used for the semiconductor apparatus of the present invention.
Figure 3B:
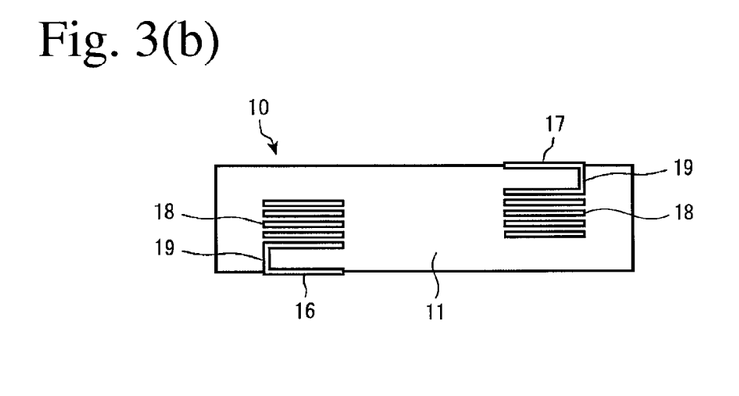
FIG. 3(b) is a cross-sectional view showing the internal structure of the inductor of FIG. 3(a).

FIGS. 3(a) and 3(b) show one example of the laminate inductors used in the present invention. In this laminate inductor 10, both ends of a coil constituted by line patterns 18 in a laminate 11 are connected to a second external terminal 16 exposed on the lower surface and an internal terminal 17 exposed on the upper surface, through via-holes 19. The second external terminal 16 is exposed from the lower surface of the molding resin 25, while the internal terminal 17 is covered with the molding resin 25.

Figure 4A:
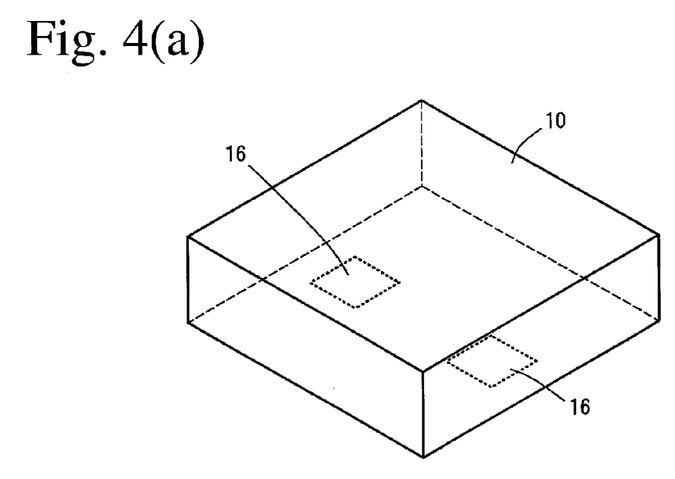
FIG. 4(a) is a perspective view showing the appearance of another inductor used for the semiconductor apparatus of the present invention.
Figure 4B:
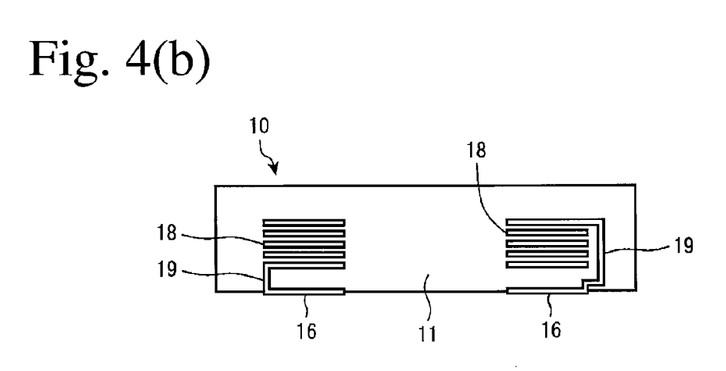
FIG. 4(b) is a cross-sectional view showing the internal structure of the inductor of FIG. 4(a).

FIGS. 4(a) and 4(b) show another example of laminate inductors used in the present invention. In this laminate inductor 10, both ends of a coil constituted by line patterns 18 in a laminate 11 are connected through via-holes 19 to second external terminals 16, 16 exposed on the lower surface. Each second external terminal 16 is exposed from the lower surface of the molding resin 25.

Because the second external terminal 16 on the bottom surface acts as a mounting terminal together with the first external terminals 15a and the dummy terminals 15b, they increase adhesion strength to the mounting board, preventing electric disconnection, damage such as cracking, etc. of the laminate inductor even if there were twisting, bending, etc. in the mounting board. Also, heat dissipation occurs from the integrated semiconductor circuit device 30 to the mounting board via electrodes having excellent heat conductivity, stabilizing the operation of the semiconductor apparatus 1. In this state, the inductor 10 is not connected to the integrated semiconductor circuit device 30, but they may be properly connected by connecting lines on the mounting board.

Figure 5:
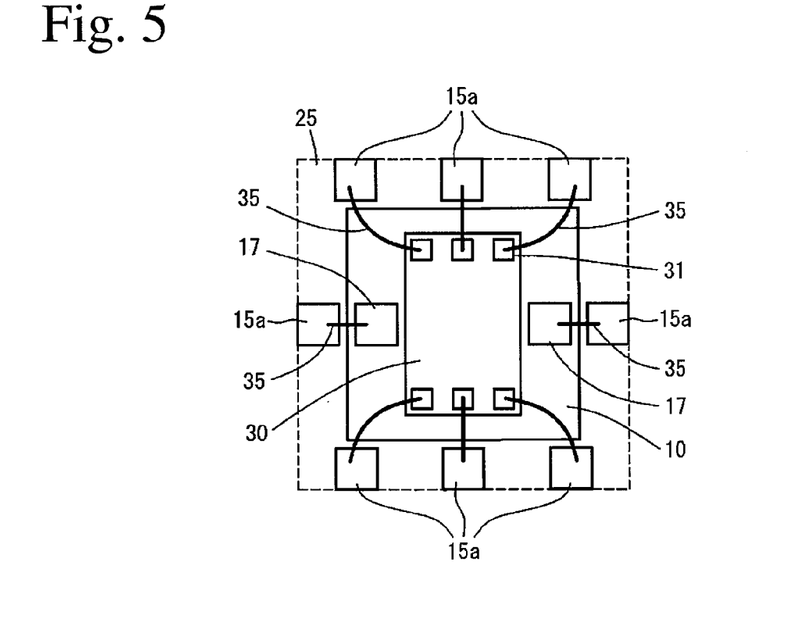
FIG. 5 is a plan view showing the internal structure of a semiconductor apparatus according to another embodiment of the present invention.

As shown in FIG. 5, the internal terminals 17 on the mounting side of the integrated semiconductor circuit device 30 can be connected to the first external terminals 15a by bonding wires. The internal terminals 17 of the inductor 30 are connected to the electrode pads 31 of the integrated semiconductor circuit device 30 via connecting lines (not shown) on the mounting board, but the internal terminals 17 may be directly connected to the electrode pads 31 via bonding wires.

Figure 6:
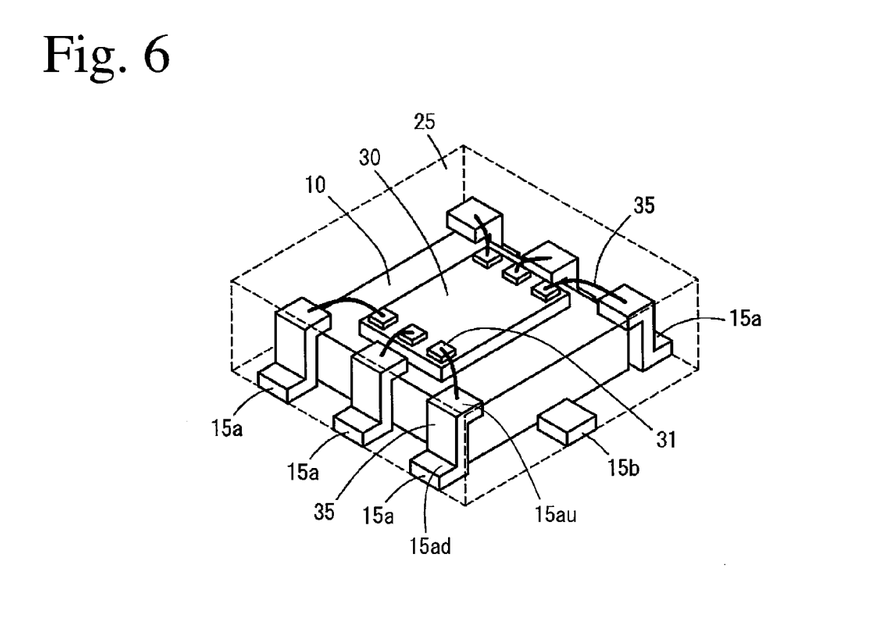
FIG. 6 is a perspective view showing the internal structure of a semiconductor apparatus according to a further embodiment of the present invention.

Each first external terminal 15a shown in FIG. 6 comprises a lower end portion 15ad bent outward from the lower surface of the inductor 10, and an upper end portion 15au bent toward the upper surface of the inductor 10. The upper end portion 15au of each first external terminal 15a is connected to each electrode pad 31 of the integrated semiconductor circuit device 30 by a bonding wire, flip mounting, etc. The first external terminals 15a may also be connected to the internal terminals 17 or other electrodes formed on the upper surface of the inductor 10.

The inductor 10 is preferably made of soft ferrite (Li ferrite, Mg ferrite or Ni ferrite). Li ferrite and Mg ferrite have magnetic properties that little change by stress, and Ni ferrite has small core loss. The addition of Sn to Ni ferrite makes the change of its magnetic properties by stress smaller. Soft ferrite used for the inductor 10 is properly selected, taking the conversion efficiency of the semiconductor apparatus, etc. into consideration. Soft ferrite generally has thermal conductivity of about 5 W/m·k. To improve the DC superimposition characteristics of the inductor 10, the inductor 10 may have a magnetic gap formed by a non-magnetic material in the magnetic circuit.

Figure 7:
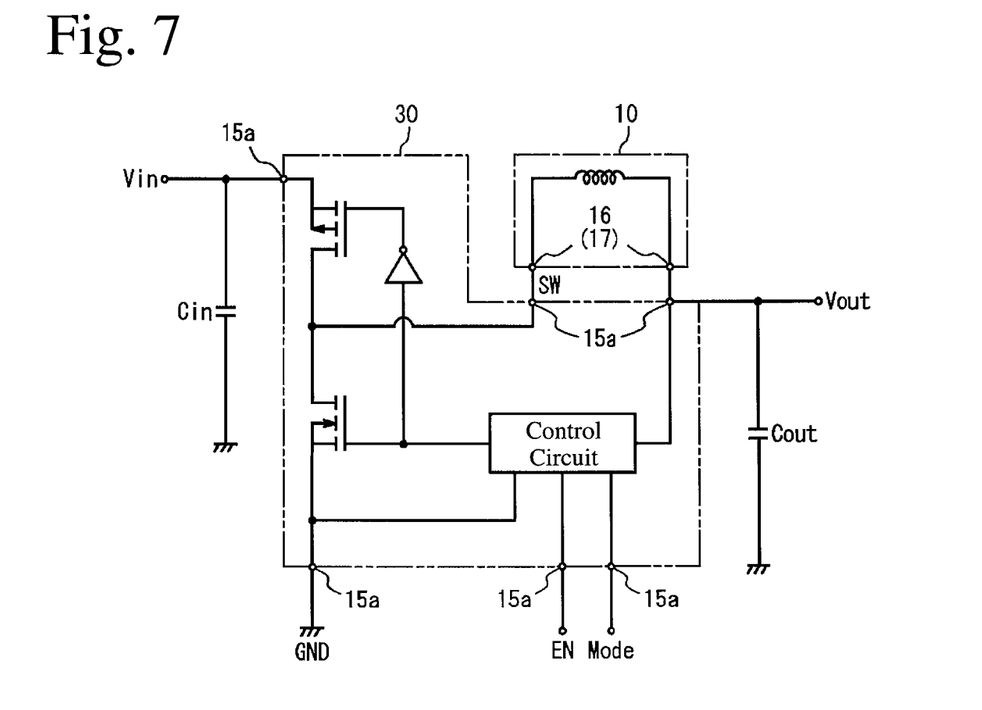
FIG. 7 is a view showing one example of power supply circuits comprising the semiconductor apparatus of the present invention.

The connection of the inductor 10 and the integrated semiconductor circuit device 30 provides a power supply circuit having the circuit shown in FIG. 7 as a semiconductor apparatus. This power supply circuit is a voltage-step-down-type DC-DC converter. The integrated semiconductor circuit device 30 comprises switching devices (MOS transistors), a control circuit alternately turning on and off the switching devices, and an inverter. An input capacitor Cin provided for the stabilization of input voltage Vin during operation and for the prevention of voltage spike may be omitted. A smoothing circuit (filter circuit) for outputting DC voltage Vout is constituted by the inductor 10 for conducting the charge and discharge of current energy, and an output capacitor Cout for conducting the charge and discharge of voltage energy.

Figure 1A:
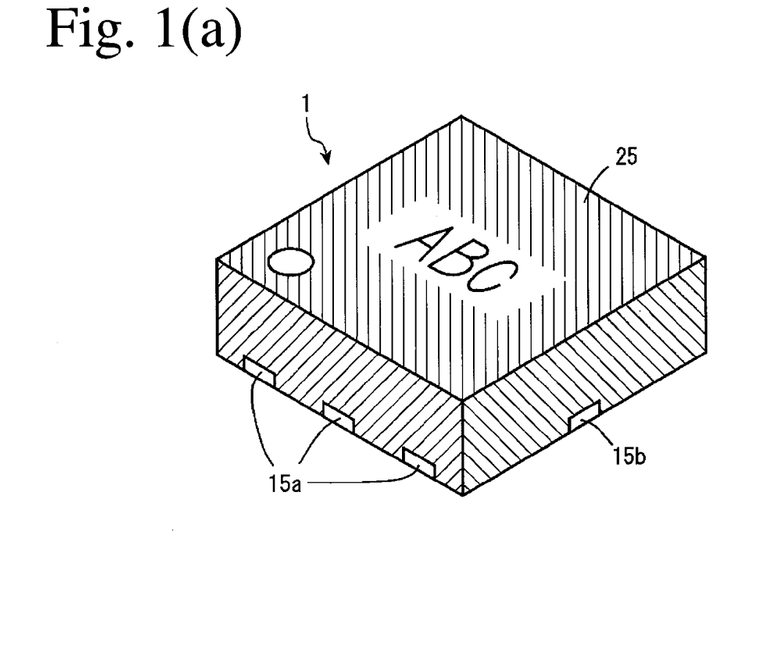
FIG. 1(a) is a perspective view showing an upper surface of a semiconductor apparatus according to one embodiment of the present invention.
Figure 1B:
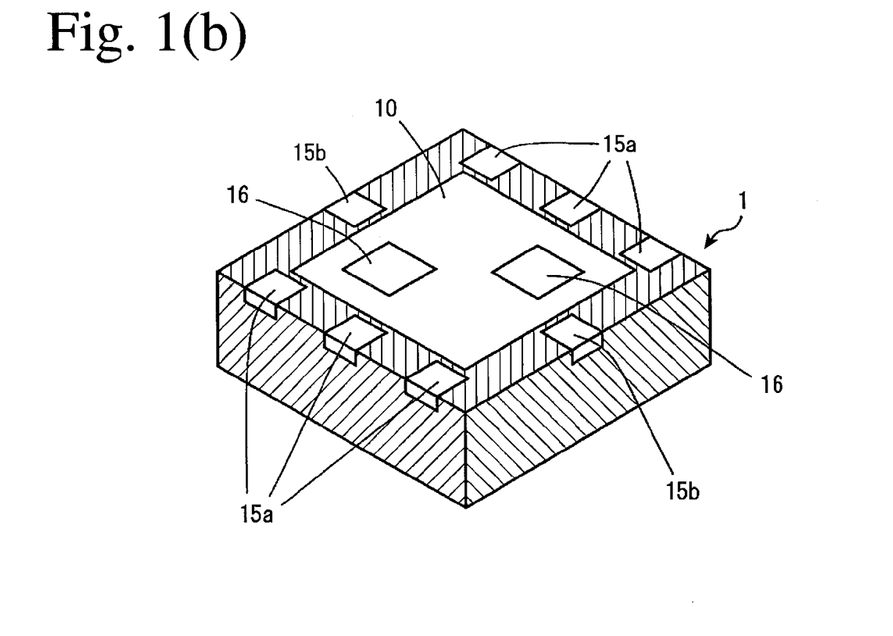
FIG. 1(b) is a perspective view showing a bottom surface of the semiconductor apparatus of FIG. 1(a).
Figure 1C:
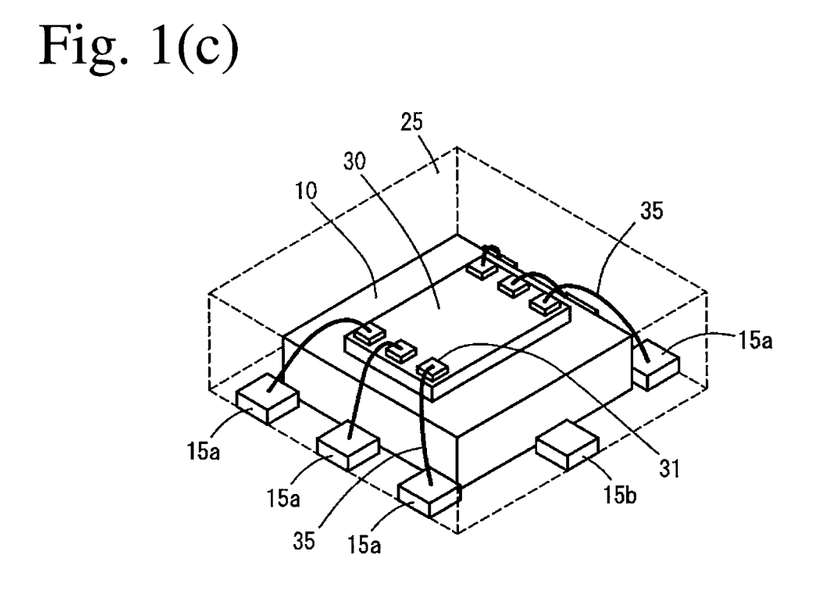
FIG. 1(c) is a perspective view showing the internal structure of the semiconductor apparatus of FIG. 1(a).
Figure 1D:
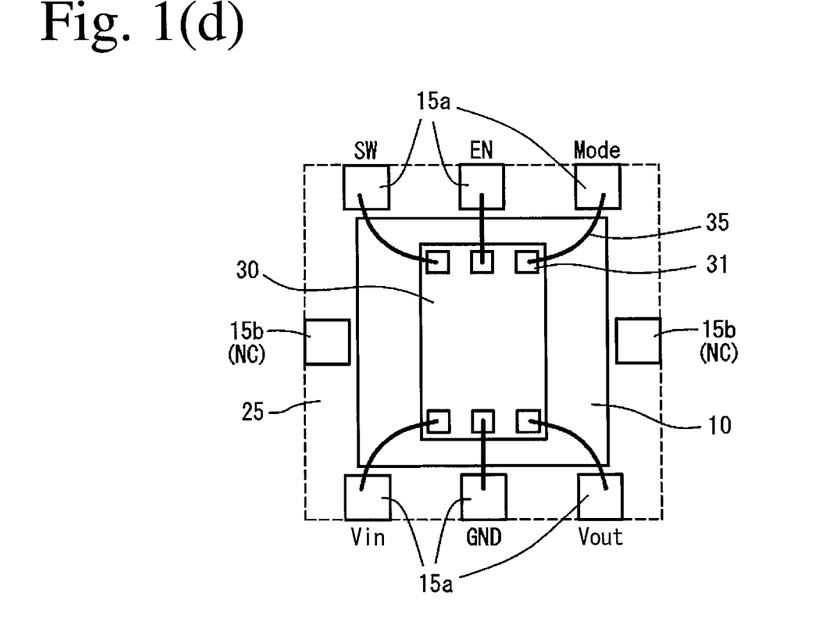
FIG. 1(d) is a plan view showing the internal structure of the semiconductor apparatus of FIG. 1(a).

The symbols of Vin, Vout, GND, SW, EN and Mode are added to the first external terminals 15a in FIGS. 1(d) and 7, but terminals for controlling the ON/OFF of the switching devices are omitted. Vin and Vout are respectively connected to the input and output terminals of the integrated semiconductor circuit device 30. GND is connected to the ground terminal of the integrated semiconductor circuit device 30. EN is connected to a terminal for controlling the ON/OFF of the output of the integrated semiconductor circuit device 30. Mode is connected to the output-voltage-controlling terminal of the integrated semiconductor circuit device 30.

Figure 8:
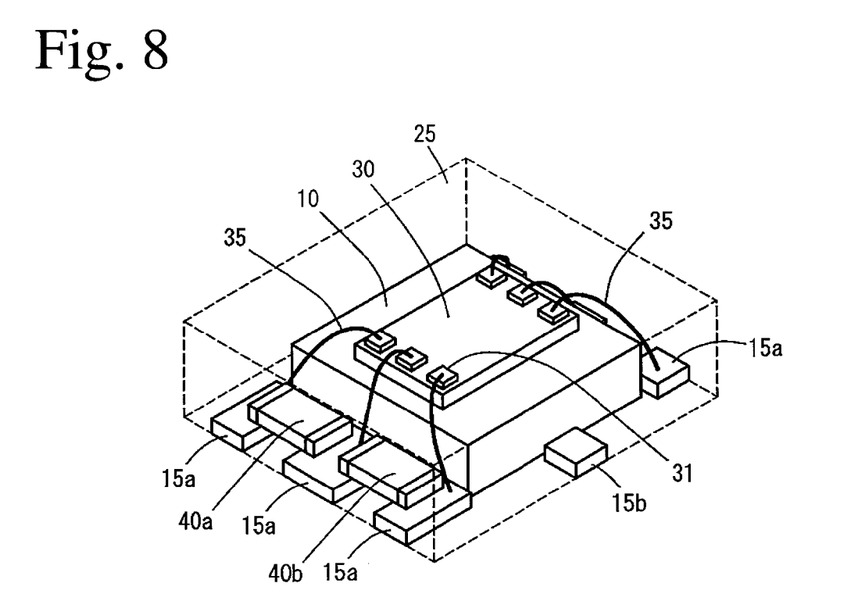
FIG. 8 is a perspective view showing the internal structure of a semiconductor apparatus according to a still further embodiment of the present invention.

As shown in FIG. 8, the power supply circuit may contain an input capacitor Cin and an output capacitor Cout between the adjacent first external terminals 15a, 15a. Although the illustrated circuit is a voltage step-down type, a step-up type or other circuit structures may be used, of course, in the present invention.

Figure 9:
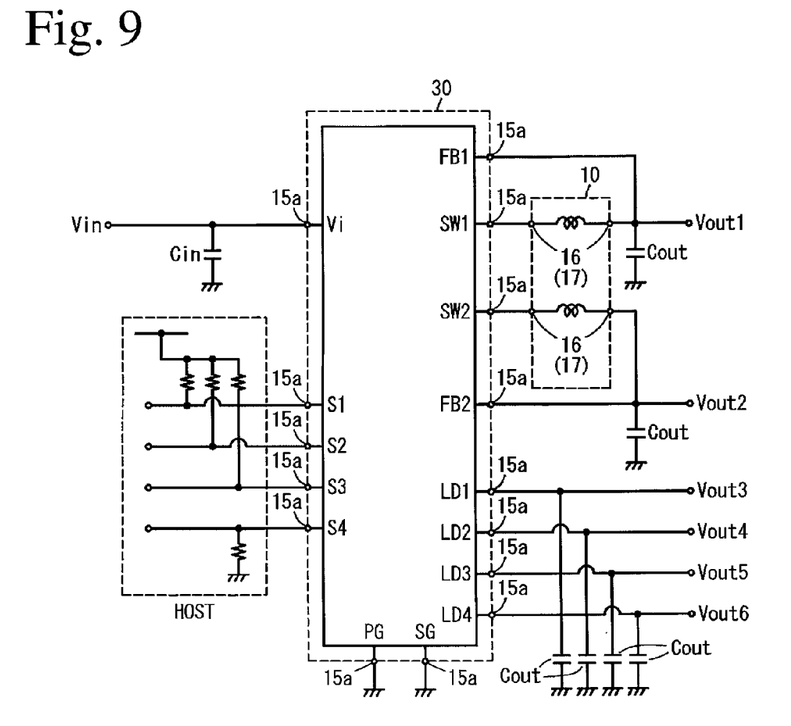
FIG. 9 is a view showing another example of power supply circuits comprising the semiconductor apparatus of the present invention.

FIG. 9 shows a power supply circuit comprising a multi-output power management IC as the integrated semiconductor circuit device. This power supply circuit receives a control signal from a host HOST to turn on and off pluralities of switching devices for converting input voltage, supplying DC power to output terminals Vout1, Vout2. It also has four series regulators outputting DC powers Vout3-Vout6. Because an inductor 10 in this power supply circuit is constituted by an inductor array having two inductor coils, the number of the second external terminals 16 and internal terminals 17 are 4 at maximum.

Figure 10:
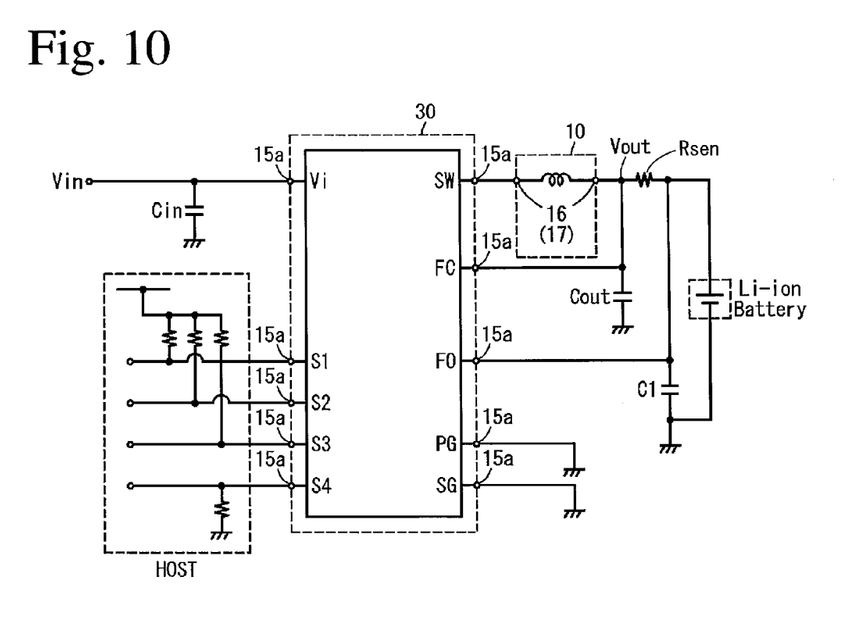
FIG. 10 is a view showing a further example of power supply circuits comprising the semiconductor apparatus of the present invention.

As another example of power supply circuits, FIG. 10 shows a power supply circuit comprising IC for a secondary battery charger as the integrated semiconductor circuit device. This power supply circuit receives a control signal from a host HOST to turn on and off pluralities of switching devices for converting input voltage, thereby supplying DC power to an output terminal Vout. Current for charging a secondary battery (lithium ion battery) is detected at both ends of a charging-current-detecting resistor Rsen connected in series to the inductor 10, and the charging current is optimally controlled depending on the output voltage by the control signal from the host HOST.

Example 1

Figure 11:
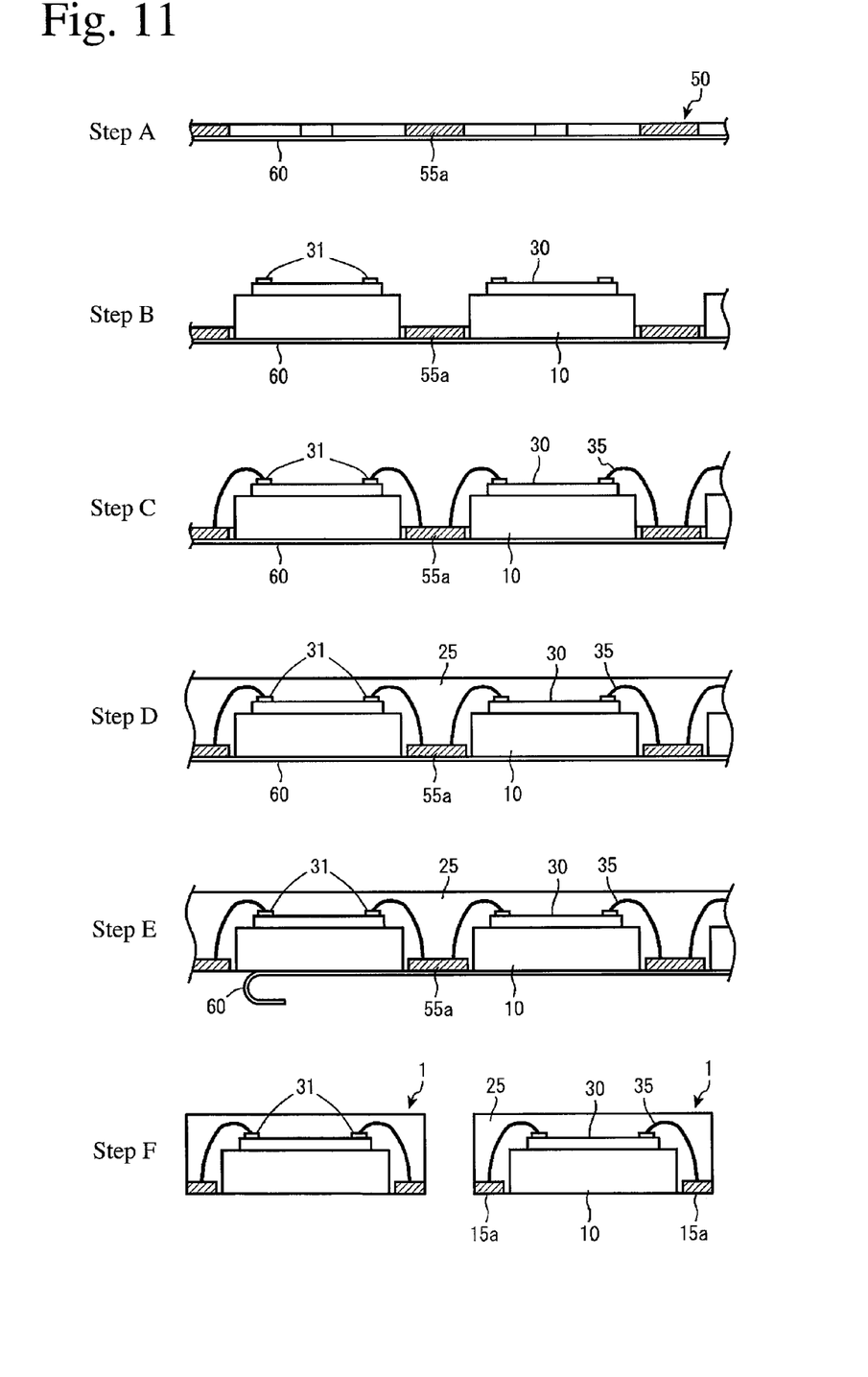
FIG. 11 is a schematic view showing the production steps of a semiconductor apparatus according to one embodiment of the present invention.

FIG. 11 shows one example of methods for producing the semiconductor apparatus of the present invention having the structure shown in FIGS. 1(a)-1(d). To assemble the semiconductor apparatus, the leadframe 50 shown in FIG. 2 was used. The leadframe 50 was produced by etching a 0.15-mm-thick copper alloy sheet and plating it with Ag. To improve solderability, the leadframe 50 was provided with Sn—Bi plating on the rear surface.

The leadframe 50 comprises pluralities of tie bars 52 perpendicularly extending inside the frame 51, to divide the inside of the frame 51 to pluralities of (15 in this Example) compartments each for forming a semiconductor apparatus. In each compartment, leads 55a, 55b extend integrally from the frame 51 and the tie bars 52, and a free end of each lead 55a, 55b does not reach a center of each compartment to define an opening 56. The leads 55a, 55b extend linearly with the same width and length, but they may have different width and length. Also, each lead may have a partially different width such that it is wide in a portion connected to a bonding wire. The leads 55a, 55b may extend in different directions, for instance, in radial directions. Further, the leads 55a, 55b may be curved or bent partially in a horizontal or vertical direction. The frame 51 may be in a long tape shape.

An assembly tape 60 comprising a 100-μm-thick polyimide support film and a 20-μm-thick aromatic polyetheramideimide adhesion layer was attached to one entire surface of the leadframe 50, and adhered by compression at 200° C. and 5 MPa for 10 seconds (step A).

A laminate inductor 10 having the structure shown in FIGS. 4(a) and 4(b) was attached to a portion of the assembly tape 60 exposed to the region 56 surrounded by the leads 55a, 55b of the leadframe 50 (step B). The laminate inductor 10 had an outer size of 1.5 mm×1.5 mm×0.55 mm, and both ends of the contained coil having a core made of Ni ferrite containing Sn as a sub-component were connected to the second external terminals 16, 16 on the lower surface. The laminate inductor 10 was attached to the assembly tape 60 by compression at 200° C. and 5 MPa for 10 seconds as in the case of the leadframe 50. The adhesion conditions may be properly changed depending on the required adhesion.

Fixed to the upper surface of the inductor 10 was an integrated semiconductor circuit device 31 having an outer size of 1.1 mm×0.7 mm×0.1 mm, and having a 25-μm-thick DAF tape (not shown) attached to the bottom surface. When the integrated semiconductor circuit device 30 is fixed to the mounting electrodes on the upper surface of the inductor 10 with a conductive paste such as silver paste, it is preferably heated at 120-200° C. for 30-60 minutes.

Figure 12:
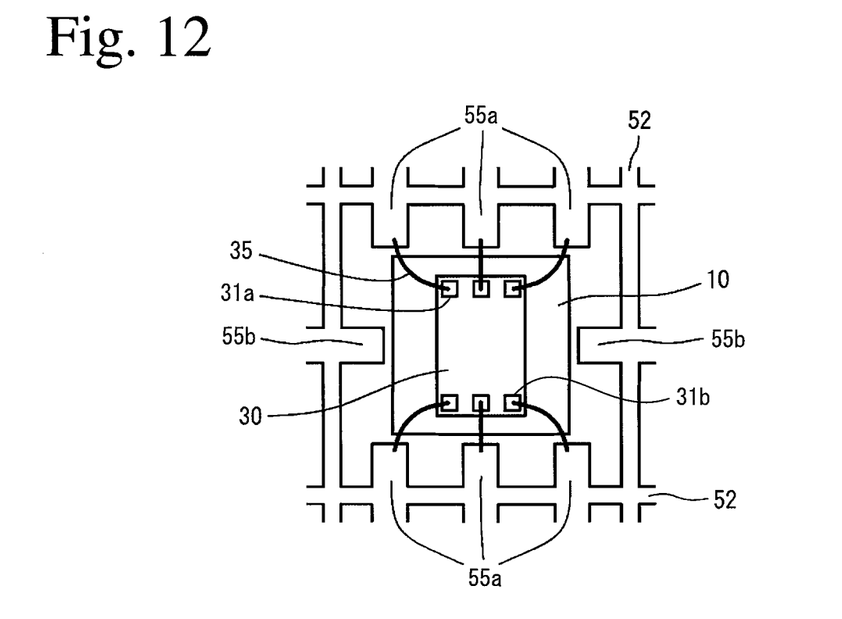
FIG. 12 is a plan view showing the positional relations among the inductor, the integrated semiconductor circuit device and the leadframe in the step C of FIG. 11.

Gold wires 35 were brought into contact with the electrode pads 31 of the integrated semiconductor circuit device 30 and the leads 55a, 55b of the leadframe 50, and heated at 250° C. for 5 minutes for wire bonding (step C). In FIG. 12 showing a wire-bonded state, the upper-side electrode pads 31a of the integrated semiconductor circuit device 30 were connected to the upper-side leads 55a, and the lower-side electrode pads 31b were connected to the lower-side leads 55b. Two leads 55b, 55b on both sides of the inductor 10 were not connected to the electrode pads 31, but used as terminals NC for improving adhesion strength to the mounting board. Of course, the terminals NC may be connected to the electrode pads 31 and the second external terminals 16 and internal terminals 17 of the inductor 10.

Pluralities of integrated semiconductor circuit devices 30 and inductors 10 were printed with a liquid phenol novolak epoxy resin sealer as a molding resin in a post-curing thickness of 1.0 mm, and cured by heating at 250° C. for 2 hours for overall sealing (step D). Thereafter, the assembly tape 60 was peeled while heating at 100-200° C., lest that the adhesive (resin layer) of the assembly tape 60 remained on the leadframe 50, the inductor 10 and the molding resin 25 (step E). A remaining resin layer, if any, is removed by a solvent.

The sealed leadframe 50 was divided by a cutting saw to each integrated semiconductor circuit device 30, to produce a semiconductor apparatus having an outer size of 2.1 mm×2.1 mm×1.0 mm (step F). Using a water jet or a laser in place of the cutting saw, the leadframe 50 may be cut. The order of the steps E and F may be changed. In this case, the leadframe 50 is divided without cutting the assembly tape 60, so that the semiconductor apparatus 1 remains kept by the assembly tape 60 for easy handling.

Comparative Example 1

A semiconductor apparatus having an outer size of 2.1 mm×2.1 mm×1.15 mm was produced in the same manner as in Example 1, except for using a leadframe having such long leads as to overlap the second external terminals 16 of the inductor 10 to solder the leads to the second external terminals 16. This semiconductor apparatus was thicker than that of Example 1 by the thickness of the leadframe. Also, the lower surface of the inductor 10 was mostly covered with a molding resin 25, resulting in poor heat dissipation.

Each of 15 semiconductor apparatuses of Example 1 and 15 semiconductor apparatuses of Comparative Example 1 was mounted on a center of a printed circuit board for test, and the external terminals of each semiconductor apparatus were bonded to the lands of each printed circuit board by eutectic solder. Using Autograph (AG-1 available from Shimadzu Corporation), a load was applied 5 times to a center of the printed circuit board on the rear surface side until deformation reached 1.0 mm, to conduct a three-point bending test. As a result, any semiconductor apparatuses of Example 1 and Comparative Example 1 did not detach from the printed circuit boards, nor did the external terminals from the lands. However, some semiconductor apparatuses of Comparative Example 1 suffered cracking in the inductors and the integrated semiconductor circuit devices.

Example 2

Figure 13A:
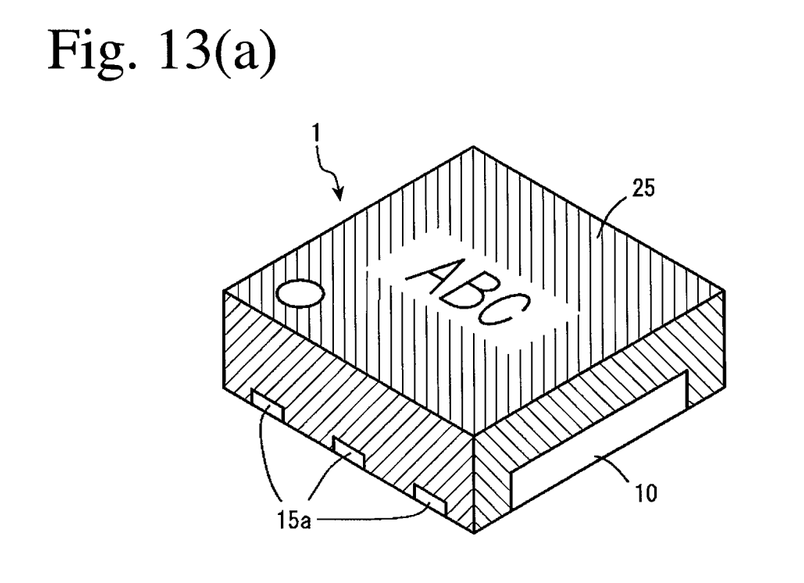
FIG. 13(a) is a perspective view showing an upper surface of a semiconductor apparatus according to a still further embodiment of the present invention.
Figure 13B:
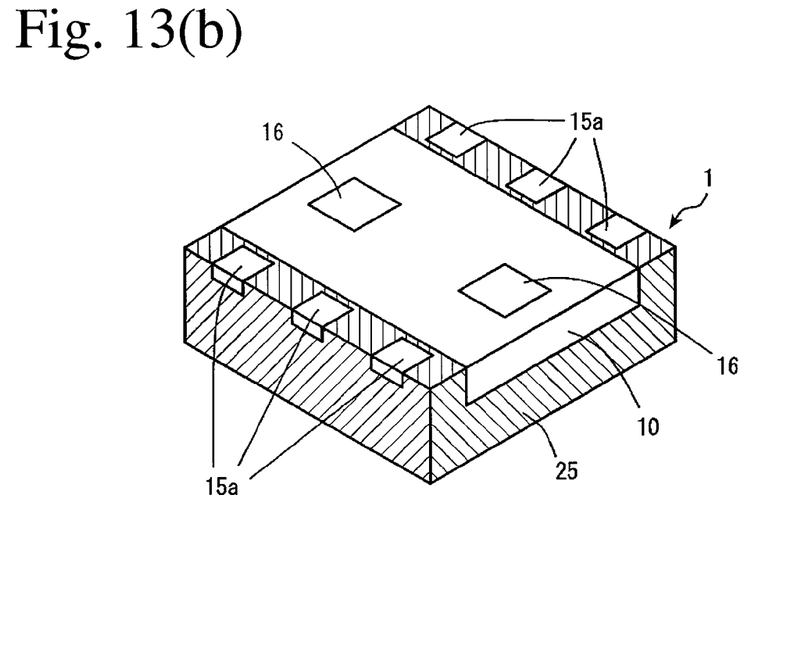
FIG. 13(b) is a perspective view showing a bottom surface of the semiconductor apparatus of FIG. 13(a).
Figure 13C:
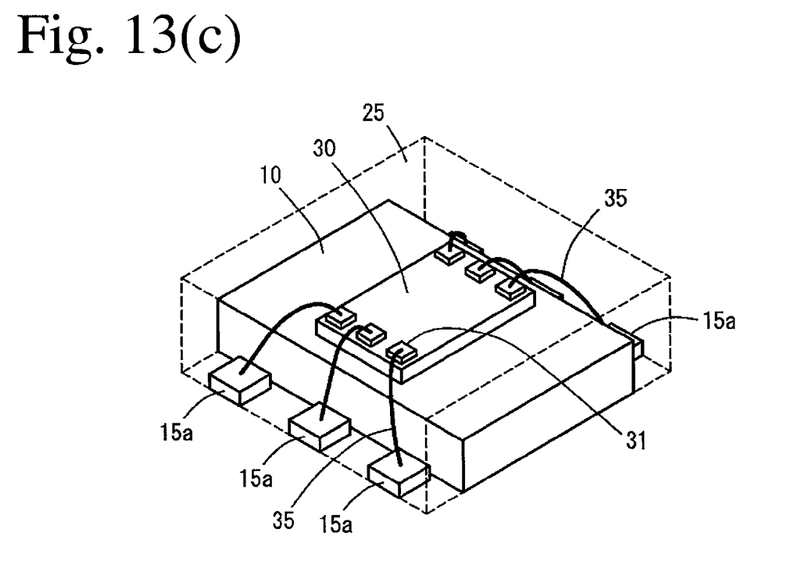
FIG. 13(c) is a perspective view showing the internal structure of the semiconductor apparatus of FIG. 13(a).

The semiconductor apparatus shown in FIGS. 13(a)-13(c) and having an outer size of 2.1 mm×2.1 mm×0.9 mm was produced in the same manner as in Example 1, except for using a leadframe 50 free of leads 55b acting as terminals NC. Because the inductor 10 has a larger mounting region by the absence of the terminals NC, the inductor 10 used may be larger in a planar direction than that of Example 1. Because of the expanded magnetic path area, a thinner inductor may be used than in Example 1 as long as it has the same inductance. Because the inductor 10 used in this Example had an outer size of 2.1 mm×1.5 mm×0.45 mm, two opposing sides of the inductor 10 were exposed from the molding resin 25. This semiconductor apparatus was thinner than that of Example 1 by the thickness of the inductor 10 despite no difference in electric characteristics. The inductor 10 and the integrated semiconductor circuit device 30 were not cracked even in the three-point bending test.

EFFECT OF THE INVENTION

According to the present invention, parasitic inductance is reduced between the first external terminals connected to the mounting board and the integrated semiconductor circuit device, and the semiconductor apparatus is made thinner with improved heat dissipation. Because the integrated semiconductor circuit device is disposed on the inductor, the semiconductor apparatus occupies a small mounting area, resulting in miniaturization. Also, because it can be produced in substantially the same step as packaging the integrated semiconductor circuit device, the semiconductor apparatus of the present invention is inexpensive. A power supply circuit comprising the semiconductor apparatus of the present invention, which is small and has excellent heat dissipation characteristics, is small, and has excellent conversion efficiency, etc.

What is claimed is:

1. A semiconductor apparatus comprising:
an integrated semiconductor circuit device having pluralities of electrode pads,
pluralities of first external terminals connected to the electrode pads of said integrated semiconductor circuit device,
dummy terminals not electrically connected to said first external terminals,
an inductor disposed in a region surrounded by said first external terminals and said dummy terminals, and a resin portion sealing them,
said inductor being formed by one or two inductor coils, said integrated semiconductor circuit device being arranged on an upper surface of said inductor, and said inductor being exposed from a lower surface of said resin portion together with said first external terminals.

2. The semiconductor apparatus according to claim 1, wherein lower surfaces of said first external terminals and a lower surface of said inductor are substantially on the same plane.

3. The semiconductor apparatus according to claim 1, wherein the upper surface of said inductor is provided with internal terminals, which are connected to said first external terminals via wires.

4. The semiconductor apparatus according to claim 1, wherein said inductor has a rectangular plate shape, whose side surfaces are provided with steps or inclination such that said inductor has a larger upper surface than a lower surface.

5. The semiconductor apparatus according to claim 1, further comprising a capacitor connected between adjacent first external terminals, said capacitor being sealed by said resin portion.

6. The semiconductor apparatus according to claim 1, wherein said first external terminals are constituted by terminal portions in a resin substrate.

7. A power supply circuit comprising the semiconductor apparatus recited in claim 1.

8. The semiconductor apparatus of claim 1, wherein the one or two inductor coils of said inductor are electrically connected to coil terminals which are exposed on the lower surface of the resin portion together with the first external terminals.

9. The semiconductor apparatus according to claim 1, wherein each of said plurality of first external terminals has a lower end portion bent outward from a lower surface of said inductor, and an upper end portion bent toward the upper surface of the inductor.

10. The semiconductor apparatus according to claim 9, wherein said integrated semiconductor circuit device is flip-chip bonded to the upper end portions of the first external terminals.

11. The semiconductor apparatus according to claim 1, wherein said first external terminals and said dummy terminals are constituted by lead terminals of a leadframe.

12. A semiconductor apparatus comprising:
an integrated semiconductor circuit device having pluralities of electrode pads,
pluralities of first external terminals constituted by lead terminals of a leadframe and connected to the electrode pads of said integrated semiconductor circuit device,
an inductor disposed in a region surrounded by said first external terminals, and a resin portion sealing them,
said inductor being formed by one or two inductor coils,
said integrated semiconductor circuit device being arranged on an upper surface of said inductor, and
said inductor being exposed from a lower surface of said resin portion together with said first external terminals.

13. The semiconductor apparatus according to claim 12, wherein each of said plurality of first external terminals has a lower end portion bent outward from a lower surface of said inductor, and an upper end portion bent toward the upper surface of the inductor.

14. The semiconductor apparatus according to claim 13, wherein said integrated semiconductor circuit device is flip-chip bonded to the upper end portions of the first external terminals.

15. The semiconductor apparatus according to claim 12, wherein lower surfaces of said first external terminals and a lower surface of said inductor are substantially on the same plane.

16. The semiconductor apparatus according to claim 12, further comprising a capacitor connected between adjacent first external terminals, said capacitor being sealed by said resin portion.

17. A power supply circuit comprising the semiconductor apparatus recited in claim 12.

\* \* \* \* \*